United States Patent [19]
Cederbaum et al.

[11] Patent Number: 5,748,125
[45] Date of Patent: May 5, 1998

[54] DIGITAL DELAY INTERPOLATOR CIRCUIT

[75] Inventors: Carl Cederbaum, Fleurie; Philippe Girard, Corbeil-Essones; Patrick Mone, St. Fargeau-Ponthierry, all of France

[73] Assignee: International Business Machines Corporation, Armonk, N.Y.

[21] Appl. No.: 751,286

[22] Filed: Nov. 18, 1996

[30] Foreign Application Priority Data

Jan. 23, 1996 [EP] European Pat. Off. .............. 96480006

[51] Int. Cl.$^6$ ................................................. H03M 1/66
[52] U.S. Cl. .................................................... 341/136
[58] Field of Search ................................. 341/136, 144, 341/152; 327/141

[56] References Cited

U.S. PATENT DOCUMENTS 5,428,626  6/1995  Frisch et al. .............................. 371/27
5,489,864  2/1996  Ashuri ...................................... 327/161

FOREIGN PATENT DOCUMENTS 0562905  9/1993  European Pat. Off. .
677924   10/1995  European Pat. Off. .

OTHER PUBLICATIONS

"Single–Chip 1062MBAUD CMOS Transceiver for Serial Data Communication", pp. 32/33, IEEE International Solid State Circuits Converence, 1 Feb. 1995, 336 XP000566796.

Primary Examiner—Brian K. Young
Attorney, Agent, or Firm—Robert A. Walsh

[57] ABSTRACT

Disclosed is a delay interpolator (DI) circuit (or mixer) that can be driven by digital signals. This DI circuit may be incorporated in the loop of a delay interpolator voltage controlled oscillator (DIVCO) circuit. In turn, the digital DIVCO circuit may be inserted in the loop of a phase-locked loop (PLL) circuit for total digitalization thereof. The novel digital delay interpolator circuit (23) has the base structure of the conventional analog delay interpolator circuit except in that, at the first (bottom) level, the two standard NFET input devices which are normally controlled by an analog signal (typically generated by a preceding DAC) are respectively replaced by two arrays (24A, 24B) of smaller NFET devices connected in parallel. The gate of each NFET device of the first array is driven by a bit (c0, c1, ... ) of the true phase of the digital signal. The gate of each NFET device of the second array is driven by a bit (c0, c1, ... ) of the complementary phase of the digital signal. For instance, in the loop of a PLL circuit, this digital signal (Sfilt) is generated by the phase detector, then filtered in a digital filter and stored in a thermometer register. As a result, the DAC is no longer necessary thereby saving significant room and energy consumption.

5 Claims, 5 Drawing Sheets

DIGITAL DELAY INTERPOLATOR CIRCUIT

FIELD OF INVENTION

The present invention generally relates to phase-locked loop (PLL) and delay interpolator voltage controlled oscillator (DIVCO) circuits and more particularly to a digital delay interpolator circuit which is an essential component thereof. To date, all elements forming the loop of modern PLL circuits that are available in the market place are comprised of digital circuits except the DIVCO circuit. The latter includes a determined number (e.g. two) of delay interpolator (DI) circuits that are driven by analog signals. Consequently, such a DI circuit necessarily requires a digital to analog converter (DAC) for its operation. According to the present invention, a sort of DAC function is provided to the DI circuit in some extent, so that it can be now driven by digital signals. As a result, totally digital DIVCO circuits incorporating the same, and thus PLL circuits can now be designed and manufactured in any standard digital CMOS technology.

BACKGROUND OF THE INVENTION

As silicon technology scaling reduction progresses, there is an impetuous trend to implement more and more digital elements in analog "linear" circuits. The well known family of phase-locked loop (PLL) circuits has not escaped to this trend, and there has been an increasing interest in the incorporation of more and more digital circuits therein. To date, all the different parts forming the PLL circuit are made of digital elements, except the voltage controlled oscillator which is an essential component thereof and in particular a certain type thereof referred to as the delay interpolator voltage controlled oscillator (DIVCO) circuit. DIVCO circuits are known to have low gain (for lower loop bandwidth) and low phase noise. Therefore, there is a considerable demand at the present time to develop DIVCO circuits adapted to operate in a full digital environment. Unfortunately, conventional DIVCO circuits include a determined number (e.g. two) of delay interpolator (DI) circuits (also referred to in the technical literature as "mixers") that are driven by analog signals.

An example of such modern PLL circuits of the prior art is disclosed in the Digest of Technical Papers, 1995 IEEE ISSCC pp 32 & 33, in an article entitled: "Single chip 1062 Mbaud CMOS transceiver for serial data communication" by J F Ewen et al, and more particularly in the FIG. 2 thereof. As apparent from this FIG. 2, the presence of a digital to analog converter (DAC) driving the DIVCO circuit demonstrates that the frequency of its output signal is controlled by an analog signal. This circuit will be referred to as an analog delay interpolator voltage controlled oscillator (ADIVCO). The conventional PLL circuit shown in FIG. 1 of the present application is identical in all respects to the PLL circuit described in FIG. 2 of the said article.

Now turning to FIG. 1, the PLL circuit referenced 10 first comprises a phase detector 11 the role of which is to generate a digital signal S at its output which is function of the phase difference between its two input signals: a reference signal labelled Sref and a digital clock signal labelled Svco generated by the ADIVCO circuit closing the loop. These signals Sref and Svco are applied to respective first and second inputs of phase detector 11. The signal S outputted by the phase detector 11 increments or decrements the digital filter 12 to ensure loop stability. The signal that is generated is stored in register 13 of the thermometer type. As known for those skilled in the art, thermometer registers have a simplified structure so that although driven by a N-bit digital signal, they only have N different contents instead of 2**N. Register 13 is incremented or decremented by the filtered digital signal labelled Sfilt. It stores the current state of the loop in the form of an N-bit wide binary word (in the present application N=16 for sake of illustration). PLL circuit 10 further comprises the digital to analog converter (DAC) and ADIVCO circuit mentioned above respectively referenced 14 and 15. The role of DAC 14 is to convert the digital signal Sfilt stored in the register 13 into either a single-ended or preferably a differential analog voltage signal labelled Sfilt*. In turn, the function of ADIVCO circuit 15 is to convert said analog voltage signal Sfilt* into the clock signal Svco using the same denomination as mentioned above the frequency of which depends on the amplitude of the Sfilt* analog signal. The clock signal Svco is applied to said second input of phase detector 11 and to other circuits as apparent from FIG. 1. Preferably, as known for those skilled in the art, at least said clock signal Svco is of the differential type (i.e. with true and complement values).

The detailed architecture of the ADIVCO circuit 15 of FIG. 1 is shown in FIG. 4 of the above mentioned article. This drawing has been incorporated in the present application as the FIG. 2 thereof. Now turning to FIG. 2A, there is shown the detailed construction of the ADIVCO circuit 15 of FIG. 1 that has a typical ring oscillator structure. ADIVCO circuit 15 is comprised of six stages serially connected to form a loop that are biased between first and second supply voltages, referred as Vdd and the ground Gnd. These supply voltages are delivered by a power supply as standard. Basically, in the loop, one can find two different types of circuits. There are two analog delay interpolator (ADI) circuits (so-called "Mixer" in the subject article) that are labelled 16-1 and 16-2 (generically referenced 16) and four delay circuits that are labelled 17-1 to 17-4 (generically referenced 17). An additional biasing circuit (not shown) provides the biasing voltages for the proper operation of these six stages of the ADIVCO circuit 15. The structure of the ADIVCO circuit 15 of FIG. 2A is conventional and will not be described in great details hereinbelow. It is driven by analog differential control signals Sfilt* and Sfilt* (so-called Vc and Vc in the article) and generates digital differential output signals Svco and Svco (corresponding to the so-called C0 and C1 signals in the article). These signals are buffered in two output buffers referenced 18-1 and 18-2.

Mixers (using the terminology employed in the subject article to designate a delay interpolator circuit) 16-1 and 16-2 are obviously the key elements of ADIVCO circuit 15. As apparent from FIG. 2B, mixer 16 has three differential input terminals labelled A, B and C. The differential input terminal labelled A is connected to the output terminal of the last but one preceding mixer. The differential input terminal labelled B is connected to the output terminal of the preceding delay circuit. Analog differential signal Sfilt* is applied to differential control input terminal labelled C. This differential input terminal controls which amount of signal from input terminal A or B passes through the mixer. When the differential signal Sfilt* on input terminal C is positive, more signal coming from input terminal A passes through the mixer, and thus less signal coming from input terminal B. Since the signal on input terminal A is one delay ahead of the signal on input terminal B, the loop delay is decreased and the frequency of oscillation is increased. Conversely, when the differential signal Sfilt* on input terminal C is negative, the loop delay is increased and the frequency of oscillation of differential output signal Svco is decreased.

Let us assume equal delays for the mixer 16 and the delay circuit 17. When only the signal on input terminal A passes, the loop period is equal to 4*D, i.e. the delay (2*D) caused by two delay circuits plus the delay (2*D) caused by two mixers. When only the signal on input terminal B passes, a similar reasoning shows that the loop period is now 6*D due to the delay (4*D) resulting of the four delay circuits plus the delay (2*D) caused by the two mixers. The tuning range of ADIVCO circuit 15 is thus (5±1)*D. In other words, the tuning range is equal to ±20%, which is relatively small when compared to VCO circuits having a different architecture that can have a tuning range greater than ±100%.

The detailed circuit construction of the mixer is shown in the first enlarged view of FIG. 2B. It can be seen that mixer 16 has two differential levels that are cascoded at nodes 19A and 19B. The interpolating or mixing function is done by means of a first differential level implemented with two input NFET devices T1 and T2 controlled by the Sfilt* and Sfilt* analog differential signals that are applied on their respective gates at input terminals C and C. This first level is fed by a current source as standard at node 20. The second level is comprised of two branches, each being formed by a pair of NFET devices. In the first branch, the gates of the two FET devices T3-1 and T3-2 are connected to their respective input terminals A and A while in the second branch, the gates of the FET devices T4-1 and T4-2 are connected to their respective input terminals B and B. The drains of NFET devices T3-1 and T4-1 on the one hand and the drains of NFET devices T3-2 and T4-2 on the other hand form common nodes 21A and 21B respectively. Each common node (21A, 21B) is correspondingly loaded by a resistively-connected PFET device (T5-1, T6-1) in parallel with a diode-connected PFET device (T5-2, T6-2). The signals OUT and OUT- outputted by mixer 16 are available at respective nodes 21B and 21A. The other enlarged view of FIG. 2B shows the detailed structure of the delay circuit 17, which is structurally quite similar to mixer 16 but has a simpler construction because the role of this circuit is just to provide a delay.

In addition, as apparent from FIG. 1, ADIVCO 15 circuit requires a digital to analog converter (DAC) 14 for its operation. FIG. 3 shows the schematic architecture of such a conventional 16-bit DAC 14 comprised of two identical main blocks 22A and 22B that is adapted to the PLL circuit 10 of FIG. 1. DAC 14 converts the 16-bit wide digital signal Sfilt comprised of bits c0 to c15 into a differential analog input signal Sfilt*. In FIG. 3, supply voltages Vdd and Gnd have not been illustrated for sake of clarity.

FIG. 4 shows the detailed structure of main block 22A which handles bits c0 to c7 of signal Sfilt. Block 22A is comprised of eight identical cells CELL 0 to CELL 7 and two load resistors RA1 and RA2 for summing the current at respective nodes NA1 and NA2. As apparent from FIG. 4, each cell, e.g. CELL 0, is comprised of three NFET devices N0-1, N0-2 and N0-3. N0-3 has its drain connected to the sources of N0-1 and N0-2, its gate connected to the biasing voltage Vx and its source connected to Gnd. Therefore, it obviously plays the role of a current source. FET de vice N0-2 has its drain connected to the load resistor RA2 at output node NA2 to generate signal Sfilt* and its gate is connected to biasing voltage Vdd/2. N0-1 has its drain connected to load resistor RA1 at node NA1 to generate signal Sfilt* and its gate is connected to the c0 bit signal of digital signal Sfilt. All other cells, CELL1 to CELL 7 are dotted at said NA1 and NA2 nodes in a similar way. When c0 and all other bit signals are at the low logic level, no current flows through devices Nx-1 (x=0 to 7) and therefore through RA1. As a result, Sfilt* is at a high output voltage. On the other side, all the current flows through RA2 and Sfilt* is at a low voltage. Similar reasoning applies when bit signal c0 and all other bit signals change to the high level. In this case, Sfilt* and Sfilt* signals have opposite values. It is worth while to remark that resistors RA1 and RA2 connected to common nodes NA1 and NA2 respectively need to have highly precise values to ensure the desired precision in main block 22A of DAC 14 (same reasoning applies to main block 22B). As a result, the circuit implementation illustrated in FIGS. 3 and 4 requires 48 (relatively large) FET devices and 4 high precision resistors. The fabrication of these resistors necessitates an adequate technology offering this precision so that DAC 14 cannot be manufactured with any standard digital CMOS technology which is a serious drawback to date as explained above. In addition, DAC 14 is room consuming (area increases with N which is directly related to the desired precision).

Although the conventional ADIVCO circuit 15 of FIG. 2 presents the desired low gain (for loop stability) and the low phase noise that are mandatory to generate an output clock signal Svco with a low jitter, it is not satisfactory to meet to date needs because it has a number of drawbacks. Firstly, because of its analog nature, since an analog voltage signal, i.e. Sfilt*, is necessary for its control. As a consequence, the PLL circuit 10 of FIG. 1 cannot be made entirely with digital elements. In addition, when the PLL circuit 10 is integrated in a semiconductor chip (which is the current trend of the technology) the analog voltage signal Sfilt* that is applied to ADIVCO 15 can be polluted by the noise generated by all the digital circuitry glue integrated therein. As a matter of fact, analog signal Sfilt* can pick up noise from the power supply rails, chip substrate and digital (or analog) signals. Secondly, because it is necessary to implement high precision resistors (RA1, ...) only an analog CMOS technology is adequate. Thirdly, as known for those skilled in the art, DAC 14 is also a significant source of silicon area and power consumption because it requires a great number of active FET devices and high precision resistors. Fourthly, to get the full tuning range of the ADIVCO circuit 15, the output dynamic range voltage of the DAC 14 must be greater than the minimum voltage to completely switch-off the input FET devices of the first differential level of the mixer 16. It is very likely that these voltages will not depend on the same process parameters and will not have the same dependence on temperature. Hence, some margin is necessary to have always the output dynamic range voltage of DAC 14 greater than the minimum voltage to switch-off these input FET devices, and therefore it is necessary to increase the resolution of the DAC 14 by 1 bit thereby reducing the overall efficiency of the tuning scheme. Finally, before the ADIVCO circuit 15 reaches its new frequency after the register 13 output has been changed, it will be necessary to wait DAC 14 settling, which slows down the process and adds a delay in the PLL circuit 10 loop (not recommended for loop stability). All these drawbacks will be overcome by using the digital DIVCO circuit of the present invention.

OBJECTS OF THE PRESENT INVENTION

It is therefore a primary object of the present invention to provide a delay interpolator (DI) circuit or mixer that can be driven by digital signals.

It is another object of the present invention to provide a digital delay interpolator voltage controlled oscillator (DDIVCO) circuit that is driven by digital signals.

It is another object of the present invention to provide a digital phase-locked loop (DPLL) circuit whose all elements included in the loop are digital circuits so that it can be manufactured in a standard digital CMOS technology.

It is still another object of the present invention to provide a digital phase-locked loop (DPLL) circuit wherein the need of a digital to analog converter (DAC) which requires precision resistors is eliminated.

It is still another further object of the present invention to provide a digital phase-locked loop (DPLL) circuit that necessitates a reduced number of active (e.g. FET) devices in the loop for better performance, reduced power consumption and higher integration in a semiconductor chip.

SUMMARY OF THE PRESENT INVENTION

According to the present invention there is first disclosed a delay interpolator (DI) circuit or mixer that can be driven by digital signals. In turn, this DI circuit may be incorporated in the loop of a delay interpolator voltage controlled oscillator (DIVCO) circuit to transform it in a digital circuit. Finally, the digital DIVCO (DDIVCO) circuit may be incorporated in the loop of a phase-locked loop circuit for total digitalization thereof.

In the two-level cascoded structure of a conventional delay interpolator (DI) circuit, at the first (bottom) level, the two input NFET devices, which are normally controlled by the complementary phases of an analog signal (e.g. the Sfilt* signal generated by the DAC as standard), are respectively replaced by two arrays of smaller NFET devices that are connected in parallel that are respectively driven by the complementary phases of a digital signal. For instance, in the loop of a PLL circuit, this digital signal is typically the signal (Sfilt) generated by the phase detector and filtered in a digital filter as standard. In each array, each NFET device gate is driven by a bit of the digital signal.

These two arrays of NFET devices somewhat play the role of a simplified DAC that would not require any high precision resistors and operate with a reduced number of FET devices of a smaller size. As a result, totally digital DI circuits with better performances can now be designed and manufactured in any digital CMOS technology. In turn, said totally digital DI circuits can be incorporated in DIVCO and PLL circuits for total digitalization thereof.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

BRIEF DESCRIPTION OF THE DRAWINGS

FIG. 2 is comprised of FIGS. 2A and 2B.

DESCRIPTION OF THE PREFERRED EMBODIMENTS

Figure 2A:
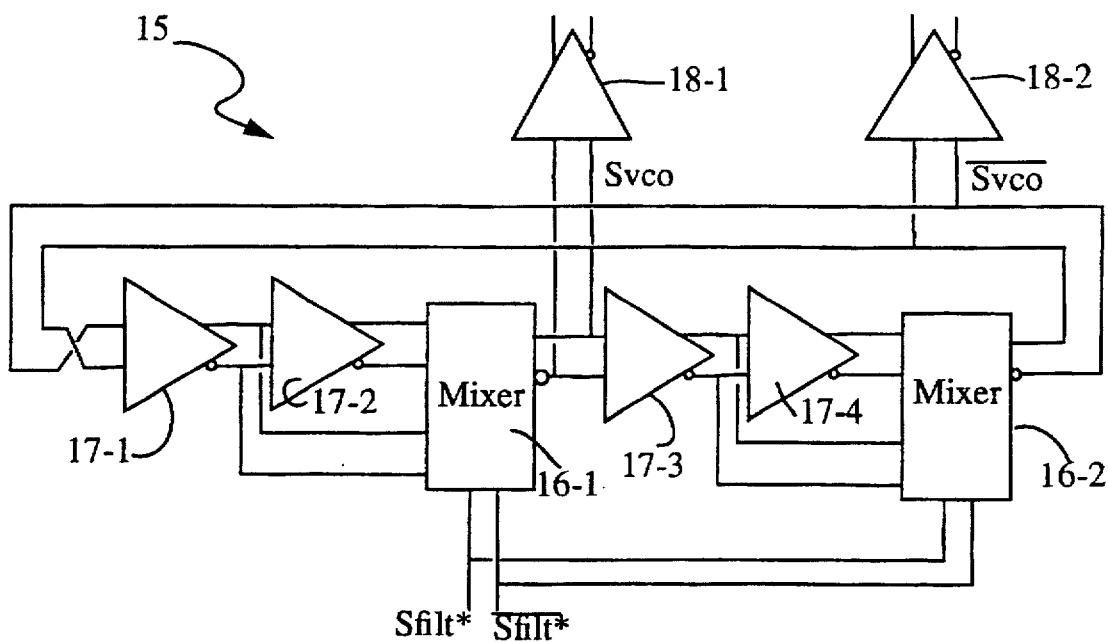
FIG. 2A shows the schematic block diagram of a conventional analog delay interpolator voltage controlled oscillator (ADIVCO) circuit of the prior art and FIG. 2B shows circuit details thereof.
Figure 2B:
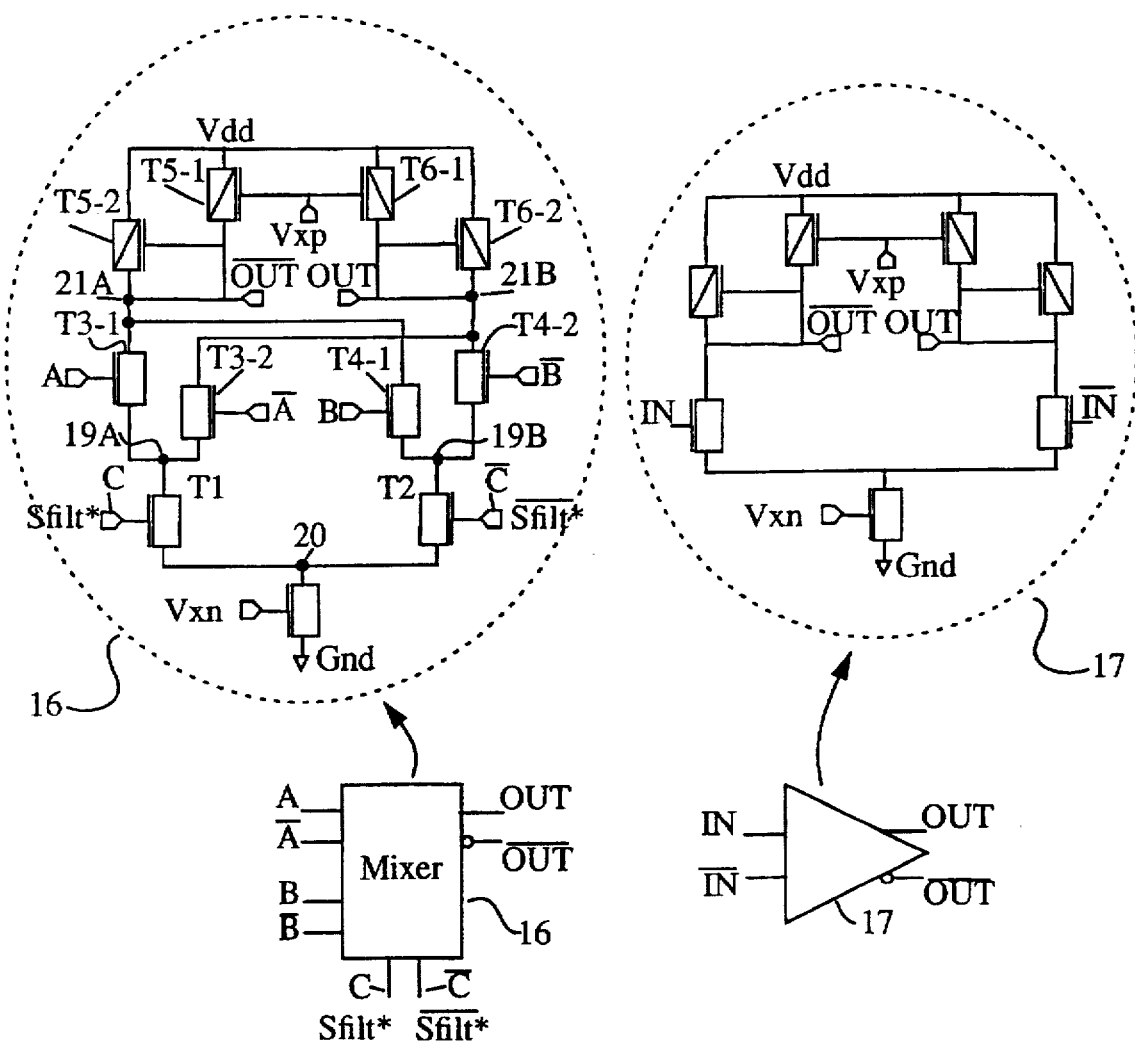
Figure 3:
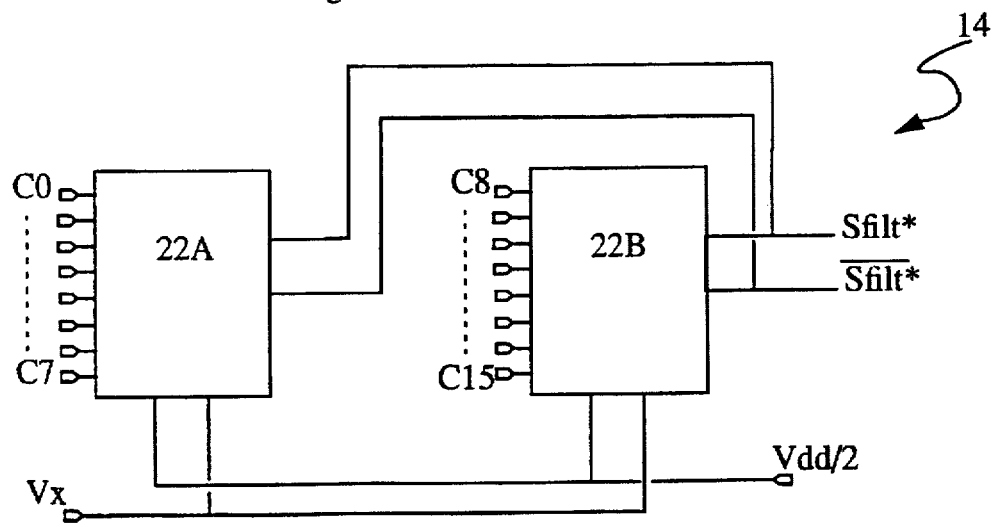
FIG. 3 shows the schematic block diagram of the a conventional 16-bit digital to analog converter (DAC) of the prior art which is comprised of two main blocks.
Figure 4:
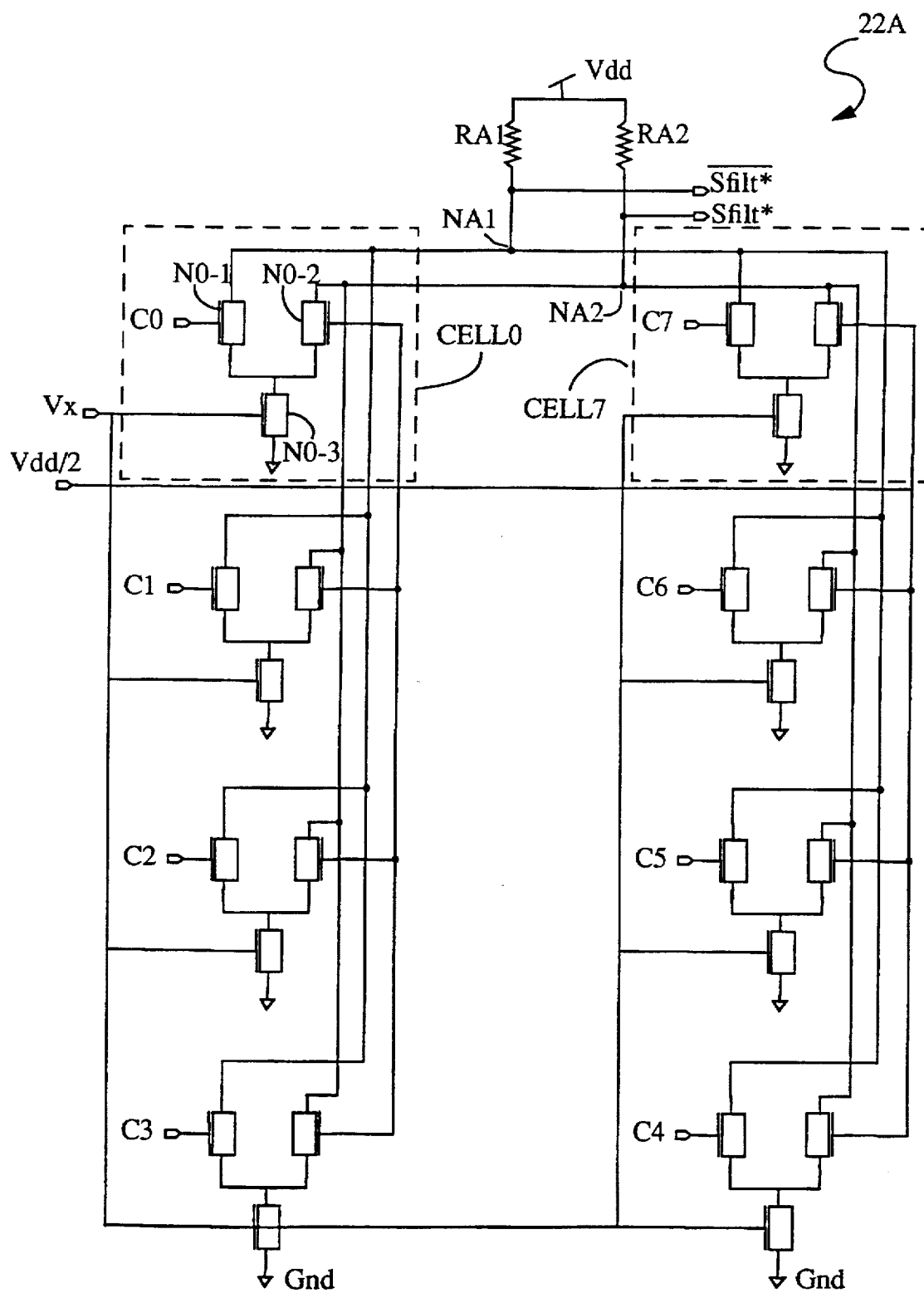
FIG. 4 shows the detailed structure of one main block of FIG. 3.

According to the present invention, it is proposed hereunder the structure of a digital DI (DDI) circuit that basically results of merging the DI circuit 16 of FIG. 2 with a circuit emulating a DAC function but structurally quite different from the DAC 14 shown in FIGS. 3 and 4. The architecture of the DI circuit 16 of FIG. 2 will be there fore used as the starting point to build the DDI circuit of the present invention. As a result, the DDI circuit is adapted to be directly driven by the digital signal Sfilt. As explained above, this signal stored in thermometer register 13 is obtained after filtering the signal S generated by the phase detector 11 in digital filter 12.

Figure 5:
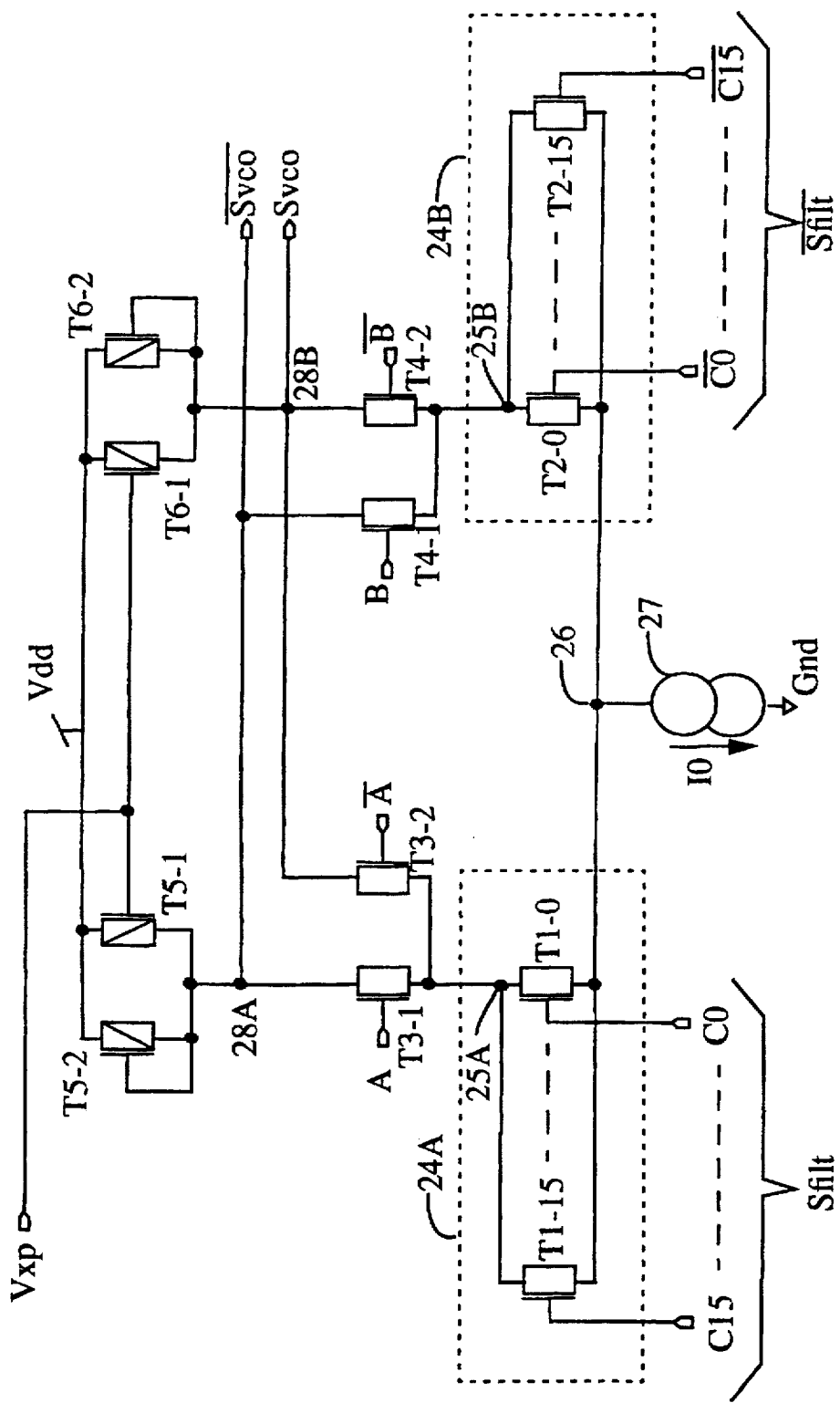
FIG. 5 shows the detailed structure of the totally digital delay interpolator (DDI) circuit according to the teachings of the present invention.

Now turning to FIG. 5, where the novel DDI circuit is referenced 23, the two input NFET devices T1 and T2 at the first differential level of mixer 16 (see FIG. 2B) have been replaced by two arrays referenced 24A and 24B of sixteen NFET devices each. Note that the principle can be extended to a greater number of NFET devices if binary signal Sfilt is wider than N=16 bits. Array 24A is comprised of NFET devices T1-0 to T1-15 while array 24B is comprised of NFET devices T2-0 to T2-15. All the NFET devices of an array have the same size and are paralleled, i.e. the sources and drains are connected to two respective common nodes. The common node for the drains of NFET devices in array 24A is referenced 25A while the common node for the drains of FET devices in array 24B is referenced 25B. The sources of all the NFET devices of both arrays 24A and 24B are connected to a single common node 26 that is fed by a current source 27 connected to the ground Gnd. Each bit signal of the digital signal Sfilt, referenced c0 to c15, is applied to the gate of the corresponding NFET device in array 24A. The same construction applies on the array 24B side, for the complementary bits c0 to c15 of binary signal Sfilt. The remaining of the DDIVCO circuit 23 is without change with respect to the mixer 16 of FIG. 2B. The A signal mentioned above and its complementary signal A are applied to the gates of respective FET devices T3-1 and T3-2. These FET devices have their sources tied to common node 25A. The B signal mentioned above and its complementary signal B are applied to the gates of respective FET devices T4-1 and T4-2. These FET devices have their sources tied to common node 25B. The drains of FET devices T3-1 and T4-1 are connected to said diode/resistive load T5-2/T5-1 mentioned above at node 28A where signal Svco is available. The drains of FET devices T3-2 and T4-2 are connected to said diode/ resistive load T6-2/T6-1 mentioned above at node 28B where signal Svco is available. All FET devices of arrays 24A and 24B have a small size (W*L). For instance, in a given digital CMOS technology, this size is equal to 2*1, which can be compared to the sizes of FET devices Nx-1, Nx-2 and Nx-3 ( x=0 to 15) of CELLS 0 to 15 which are 10*1, 10*1, and 10*4 respectively in the same technology. As a result there is at least one order of magnitude between the area required by both arrays and the area required by the DAC 14 in a semiconductor chip. It is to he noted, that the DDI circuit 23 of the present invention operates without requiring the high precision resistors of the DAC 14 of FIGS. 3 and 4.

When one FET device pertaining to array 24A is switched on(off), its counterpart on the other side is switched off(on).

Hence, the DDI circuit 23 remains monotonic as a whole. As a final result, two DDI circuits 23 can be substituted to the DI circuits 16 incorporated in the loop of DIVCO circuit 15 of FIG. 2A, to transform it in a totally digital DIVCO (DDIVCO) circuit and the latter can in turn be incorporated in the loop of a digital PLL (DPLL) circuit for total digitalization thereof.

Figure 1:
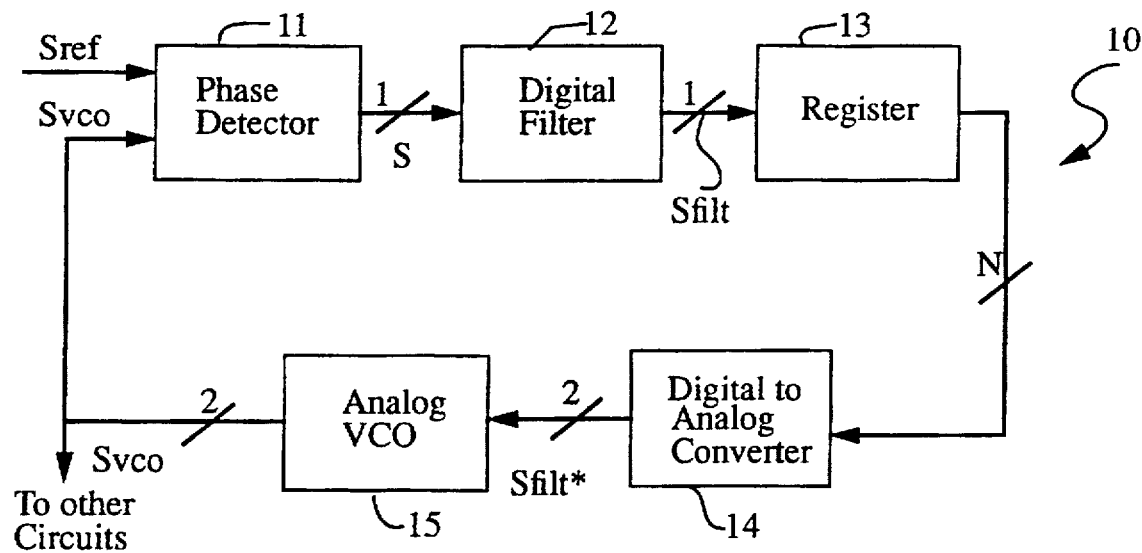
FIG. 1 shows a schematic block diagram of a conventional PLL circuit of the prior art.
Figure 6:
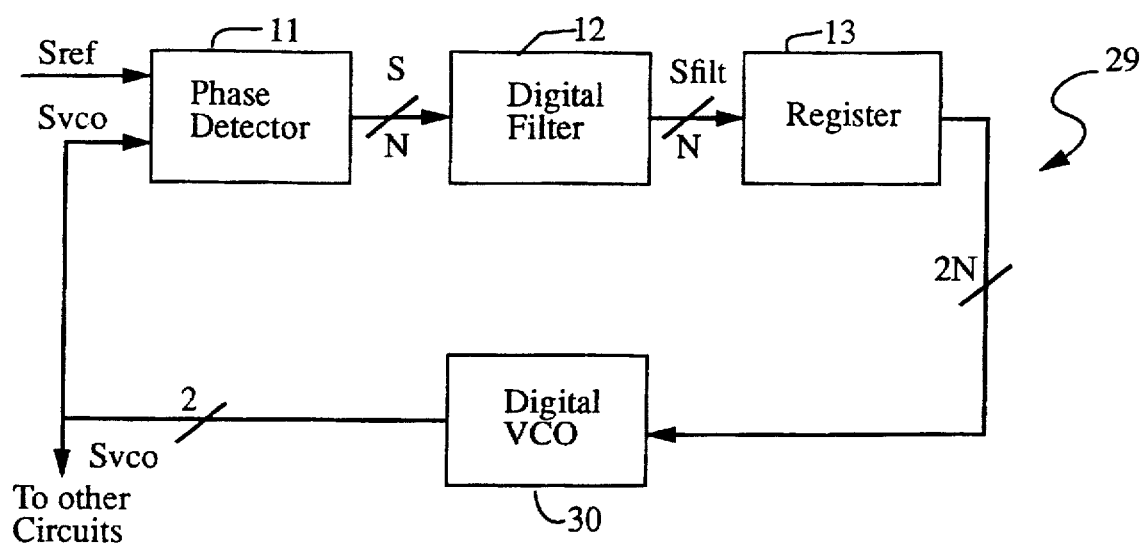
FIG. 6 shows the schematic block diagram architecture of a totally digital phase-locked loop (DPLL) circuit incorporating a digital DIVCO circuit constructed around the DDI circuits of FIG. 5.

FIG. 6 shows the schematic architecture of the novel DPLL circuit referenced 29 still according to the present invention deriving from the PLL circuit 10 of FIG. 1. It includes the DDIVCO 30 of the present invention. It is obviously simpler than the architecture of the PLL circuit 10 of FIG. 1 because the rather complex and area consuming DAC 14 has been eliminated.

Figure 7:
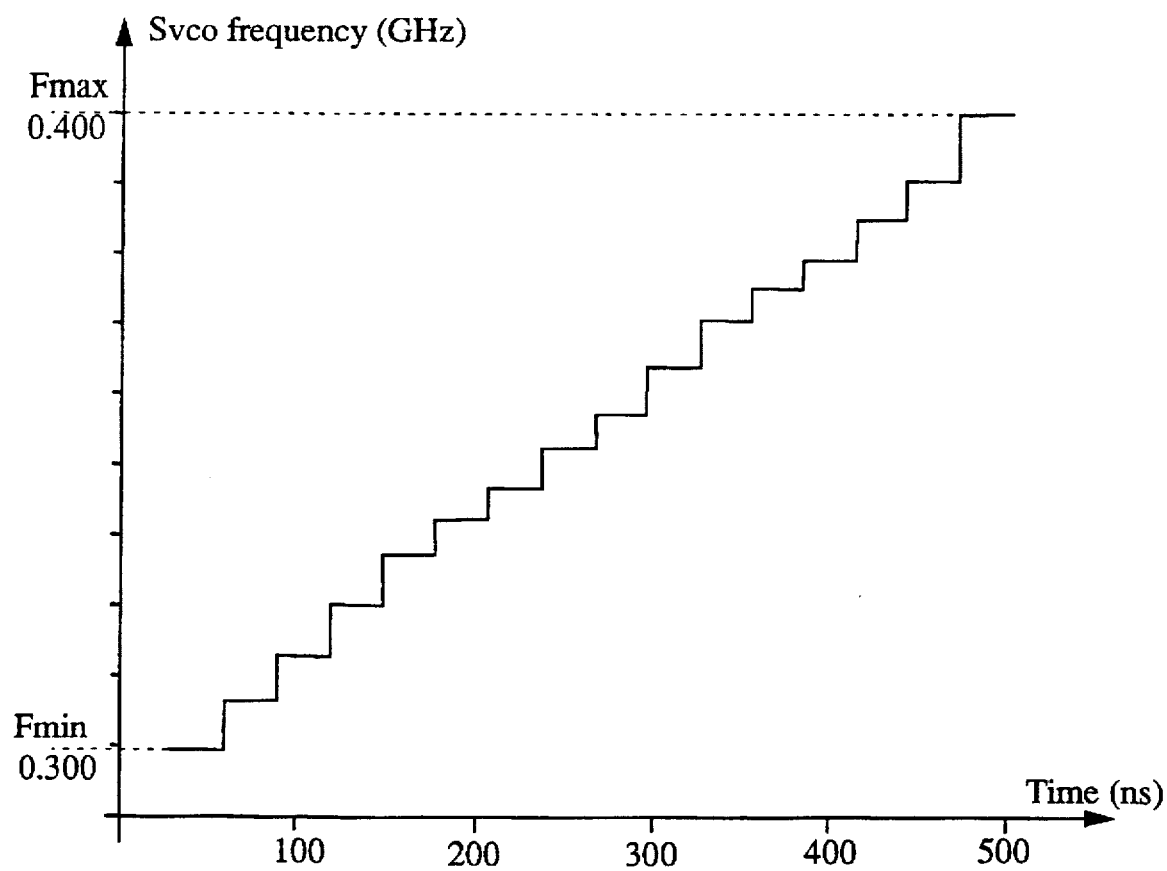
FIG. 7 shows a graph of signal Svco generated by the digital DIVCO circuit of FIG. 6 that illustrates its frequency variation as a function of time.

A DDIVCO circuit 30 including a pair of DDI circuits 23 has been designed in a high performance digital CMOS technology. FIG. 7 shows the frequency increment of signal Svco as a function of time. As illustrated in FIG. 7, 16 steps are necessary to travel from the minimum frequency (Fmin) to the maximum frequency (Fmax) in this particular case. The full frequency range of the circuit was simulated by switching-on the NFET devices of array 24A one after the other by incrementing the Sfilt signal (and hence switching-off one after the other the FET devices on the complementary side driven by signal Sfilt). The tuning range between Fmin and Fmax is about ±17%. The DDIVCO circuit 30 can always be switched from both ends of its frequency range since Fmin and Fmax frequencies correspond to the case where all the FET devices of one array are switched-on(off) and those of the other array are switched-off(on). The following TRUTH TABLE illustrates the frequency variation steps between Fmin and Fmax.

TRUTH TABLE

| Nber | Sfilt (16 bits) | frequency (in GHz) |
|---|---|---|
| 0 | 0000000000000000 | Fmin = 0,300 |
| 1 | 0000000000000001 | |
| 2 | 0000000000000011 | |
| 3 | 0000000000000111 | |
| . | . | |
| . | . | |
| 3 | 0000000000000111 | |
| . | . | |
| . | . | |
| 15 | 1111111111111111 | Fmax = 0,400 |

The disclosed solution has some definite advantages. There is no longer any analog signal in the loop of the DPLL circuit 29 that can pick up noise. As a matter of fact, digital signals are considerably less sensitive to noise than analog signals. The conventional DAC 14 has been suppressed in its original version and replaced by a very simplified structure decreasing thereby the power consumption. The two sets of very small FET devices that are necessary to construct the arrays 24A and 24B will in crease the area that was originally necessary to integrate NFET input devices T1 and T2 in the ADIVCO circuit 15 of FIG. 2, but the final result will be a significant room saving globally gained by the DAC 14 total elimination, obviating thereby the need of high precision resistors. As another consequence, the delay associated with the DAC 14 does not exist any longer, which by the way, significantly improves the loop stability of the DPLL circuit. The only minor drawback to implement the DDI-VCO circuit 30 of the present invention lies in the generation of the complementary phase of the digital input signal Sfilt, (i.e. signal Sfilt), which would normally require an inverter per bit signal. However, most latches in the register 13 have opposite phase outputs, so that no extra circuitry is required in reality.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A totally digital delay interpolator circuit (23) driven by the true and complement phases of a digital N-bit comprising a first pair of NFET devices (T3-1, T3-2) having a common source forming a first node (25A) whose respective gates are driven by the true and complement phases of a first input signal (A);

a second pair of NFET devices (T4-1, T4-2) having a common source forming a second node (25B) whose respective gates are driven by the true and complement phases of a second input signal (B);

a first array (24A) comprised of a plurality of N NFET devices (T1-0, ...) connected in parallel whose the commom drain is connected to said first node and the common source is connected to a current source (27) at a common node (26); the gate of each NFET device of the first array being driven by the respective N bits (c0, ...) of the control signal true phase; and, a second array (24B) comprised of a plurality of N NFET devices (T2-0, ...) connected in parallel whose the common drain is connected to said second node and the common source is connected to said current source (27) at said common node (26); the gate of each NFET device of the second array being driven by the respective N bits (c0, ...) of the control signal complement phase.

2. The circuit of claim 1 wherein the first pair of NFET devices has an NFET whose gate is driven by the said complement phase of said first input signal has its drain connected to a diode/resistive load (T6-2, T6-1) tied to a first supply voltage (VMd) and to the drain of an NFET device in the second pair of NFET devices whose gate is driven by the complement phase of said second signal forming thereby a first common output node (28B) where a first phase (Svco) of an output signal is generated.

3. The circuit of claim 2 wherein in the second pair pf NFET devices has an NFET device whose gate is driven by the said true phase of said second input signal has its drain connected to a diode/resistive load (T5-2, T5-1) tied to said first supply voltage (Vdd) and to the drain of an NFET device in the first pair of NFET devices whose gate is driven by the true phase (Svco) of said first input signal form ing thereby a second common output node (28A) where the second phase (Svco) of the output signal is generated.

4. The circuit of claim 3 wherein said digital control signal is generated by a thermometer register (13).

5. The circuit of claim 4 wherein all the NFET devices in both arrays have the same size.

* * * * *